United States Patent [19]

Sakai

[11] Patent Number: 4,940,688

[45] Date of Patent: Jul. 10, 1990

[54] DEVELOPER SHEET AND PROCESS FOR PRODUCING SAME

[75] Inventor: Jun Sakai, Nagoya, Japan

[73] Assignee: Brother Kogyo Kabushiki Kaisha, Nagoya, Japan

[21] Appl. No.: 289,675

[22] Filed: Dec. 27, 1988

[30] Foreign Application Priority Data

Dec. 28, 1987 [JP] Japan .................................. 62-333337

[51] Int. Cl.$^5$ ............................................... B41M 5/22
[52] U.S. Cl. ..................................... 503/200; 427/152; 503/207; 503/226
[58] Field of Search .................................. 427/150–152; 428/323, 327, 913, 914; 503/200, 207, 226

[56] References Cited

FOREIGN PATENT DOCUMENTS 2171810 9/1986 United Kingdom ................ 503/226

Primary Examiner—Pamela R. Schwartz
Attorney, Agent, or Firm—Oliff & Berridge

[57] ABSTRACT

A developer sheet having a high light resistivity comprises a layer having an electrophilic developer coated thereon, and a layer having transparent or semitransparent particles containing an ultraviolet-ray absorbent and a process for producing the developer sheet.

4 Claims, 1 Drawing Sheet

DEVELOPER SHEET AND PROCESS FOR PRODUCING SAME

FIELD OF THE INVENTION

The present invention relates to a developer sheet having high weather durability, particularly, high light resistivity and to a process for producing the developer sheet.

BACKGROUND OF THE INVENTION

There is a conventional system in which a top sheet coated with microcapsules containing minute oil drop having a nucleophilic organic color former dissolved therein and a bottom sheet coated with an electrophilic developer are put one on the other with their coated surfaces facing each other and are used as a set at the time of recording. In this case, the pressure as externally applied at the time of recording ruptures the microcapsules on the top sheet and transfers the contents of the microcapsules to the surface of the bottom sheet to thereby form an image on the developer sheet.

However, the image formed on the developer sheet (bottom sheet) by such a conventional system has a very low weather durability, particularly, light resistivity to ultraviolet rays because the dye formed by the reaction of the nucelophilic organic color former with the electrophilic developer is easily decomposed by the ultraviolet rays. The light resistivity may be improved by including an ultraviolet-ray absorbent in the developer-coated layer, but this ultraviolet-ray absorbent is likely to hinder the color-forming reaction of the nucleophilic organic color former with the electrophilic developer on the developer sheet.

SUMMARY OF THE INVENTION

An object of the present invention is to provide a developer sheet which can provide image recording with a high light resistivity.

The above object is accomplished by a developer sheet which comprises a base sheet, a first layer of an electrophilic developer coated on said base sheet, and a second layer of one of transparent and semitransparent particles containing an ultraviolet-ray absorbent, said second layer being formed on said first layer.

With the above structure, ultraviolet rays are absorbed by the particle-coated layer, whose transparent or semitransparent particles contain the ultraviolet-ray absorbent and which is disposed on the layer coated with the electrophilic developer, and therefore, the ultraviolet rays do not reach the developer-coated layer. Accordingly, the dye formed on the developer-coated layer by the color-forming reaction will now be decomposed.

Another embodiment of the present invention is a process for producing a developer sheet, comprising the steps of preparing a base sheet, forming a first layer of a nucleophilic developer, and forming a second layer of one of transparent and semitransparent particles containing an ultraviolet-ray absorbent.

DETAILED DESCRIPTION OF THE INVENTION

Figure 1:
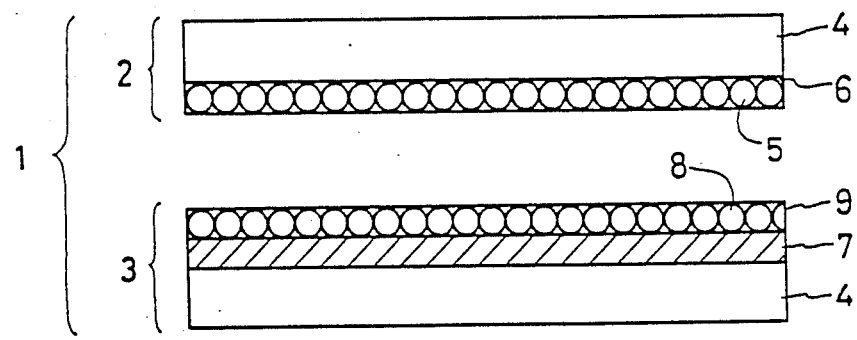
FIG. 1 is a diagram illustrating the structure of a recording system which employs a developer sheet according to the present invention.

An embodiment of the present invention will be described below with reference to the accompanying drawing.

In FIG. 1, a recording system 1 comprises a top sheet 2 and a developer sheet 3. The top sheet 2 has a microcapsule-coated layer 6 formed on a base sheet 4, the former layer 6 carrying thereon microcapsules 5 containing minute oil drop in which an nucleophilic organic color former is dissolved. The developer sheet 3 has a first layer 7 comprising an electrophilic developer and disposed on another base sheet 4, and a second layer 9 comprising transparent or semitransparent particles 8 containing an ultraviolet-ray absorbent, the second layer 9 being disposed on the first layer 7.

When pressure is externally applied on the top sheet 2 and developer sheet 3 put one on the other, the microcapsules 5 on the layer 6 at the bottom of the top sheet 2 are ruptured and oil having the color former dissolved therein is transferred to the surface of the developer sheet 3. In this case, although on the surface of the developer sheet 3 lies the second layer 9 carrying thereon the transparent or semitransparent particles 8 containing the ultraviolet-ray absorbent, this second layer 9 is porous, so that the transferred oil penetrates the second layer 9 and reaches the developer-coated layer 7. As a result, the oil contacts, and then reacts with, the developer to thereby form an image on the developer sheet 3. Even if ultraviolet rays are irradiated on the developer sheet 3 under this condition, they are absorbed by the particle-coated layer 9 and do not reach the developer-coated layer 7. Accordingly, the dye formed by the color-forming reaction are not decomposed, thus preventing the formed image from being unreadable.

As the transparent or semitransparent particles coated on the developer sheet of the present invention, an inorganic material (e.g., silica ($SiO_2$), zirconia (ZnO), etc.), polymer (e.g., polyethylene, polypropylene, polystyrene, polyvinyl acetate, polyvinyl chloride, polymethyl methacrylate, silicon, etc.), and copolymer (e.g., ethylene-propylene copolymer, ethylene-vinyl acetate copolymer, styrene-butadiene copolymer, styrene-acrylic copolymer, etc.) are used. The average diameter of these particles is preferably 0.05 $\mu$m or greater, or more preferably 0.1 to 20 $\mu$m.

As the ultraviolet-ray absorbent contained in the transparent or semitransparent particles, benzotriazoles, oxalic acid anilides, salicylic acids, benzophenones, cyano acrylates, and hindered amines may be used. The amount of the ultraviolet-ray absorbent is preferably 0.1 to 10% by weight.

The liquid medium for a coating liquid used in coating the transparent or semitransparent particles, containing the ultraviolet-ray absorbent, on the developer sheet is preferably water or water with a minute amount of a binder, such as starch, casein, polyvinyl alcohol or styrene-butadiene latex, for example, 5 to 15 parts by weight with respect to 100 parts by weight of particle powder. The amount of the liquid medium coated in solid form is preferably 1 to 10 g/m$^2$.

Suitable materials for the developer used in the developer sheet of the present invention are well known, its detailed description will be omitted here; the developer may be selected from clays, phenols, or acidic polymers of metal salts of an aromatic carboxylic acid. As the base sheet, various sheets may be used, such as, a thin glass or metal plate, and a resin film of polyethylene, polypropylene, polyethylene terephthalate, polycarbonate, polyvinyl chloride or polymethyl methacrylate.

As described above, according to the present invention, the dye formed on a developer-coated layer by the color-forming reaction will not be decomposed, the image on the developer sheet has high light resistivity and high recording preservation.

What is claimed is:

1. A developer sheet comprising a base sheet, a first layer of a nucleophilic developer coated on said base sheet, and a second layer of transparent or semitransparent particles containing an ultraviolet-ray absorbent, said second layer being formed on said first layer.

2. A developer sheet as claimed in claim 1, wherein said ultraviolet-ray absorbent is selected from the group consisting of benzotriazoles, oxalic acid anilides, salicylic acids, benzophenones, cyano acrylates, and hindered amines.

3. A developer sheet as claimed in claim 1, wherein said transparent or semitransparent particles are selected from the group consisting of silica, zirconia, polyethylene, polypropylene, polystyrene, polyvinyl acetate, polyvinyl chloride, polymethyl methacrylate, silicon, ethylene-propylene copolymer, ethylene-vinyl acetate copolymer, styrene-butadiene copolymer, and styrene-acrylic copolymer.

4. A process for producing a developer sheet comprising the steps of preparing a base sheet, forming a first layer of a nucleophilic developer on said base sheet, and forming a second layer of transparent or semitransparent particles containing an ultraviolet-ray absorbent on said first layer.

* * * * *